United States Patent [19]

Kawatani et al.

[11] Patent Number: 5,683,026
[45] Date of Patent: Nov. 4, 1997

[54] PRESSURE-BONDING UNIT AND PRESSURE-BONDING HEAD UNIT

[75] Inventors: Norio Kawatani; Hirokazu Nakayama, both of Kanagawa, Japan

[73] Assignee: Sony Corporation, Japan

[21] Appl. No.: 650,311

[22] Filed: May 20, 1996

[30] Foreign Application Priority Data

May 31, 1995 [JP] Japan .................................. 7-158597

[51] Int. Cl.⁶ .................. B23K 37/00; B23K 20/02; H01L 21/603
[52] U.S. Cl. ................................. 228/5.5; 228/447
[58] Field of Search ........................ 228/4.1, 5.5, 6.2, 228/44.7, 106, 212

[56] References Cited

U.S. PATENT DOCUMENTS

| | | | |
|---|---|---|---|
| 4,768,702 | 9/1988 | Takahashi et al. | 228/44.7 |
| 4,875,614 | 10/1989 | Cipolla et al. | 228/6.2 |
| 5,150,827 | 9/1992 | Fries | 228/44.7 |

Primary Examiner—Samuel M. Heinrich
Attorney, Agent, or Firm—Ronald P. Kananen

[57] ABSTRACT

A thermocompression-bonding unit and a pressure-bonding head unit which are structurally simple and where reliability is high. The pressure-bonding head unit includes a pressure-bonding head; pressure-bonding head holding means for integrally fixing and holding the pressure-bonding head, the pressure-bonding head holding means being formed with a cutout from a first direction side in parallel with the pressure-bonding surface and also being formed with an opening perpendicular both to the first direction and the pressure-bonding surface; first deformation means for deforming the pressure-bonding head holding means so that a cutout inlet of the cutout opens or closes by a desired amount; and second deformation means for deforming the pressure-bonding head holding means so that one opening end or the other opening end of the opening is crushed in a direction parallel to the first direction by a desired amount. Thus the pressure-bonding unit and the pressure-bonding head unit, which are structurally simple and where reliability is high, can be realized.

4 Claims, 6 Drawing Sheets

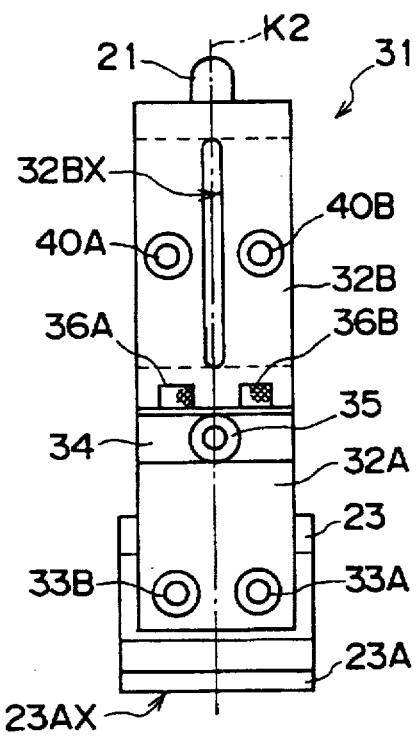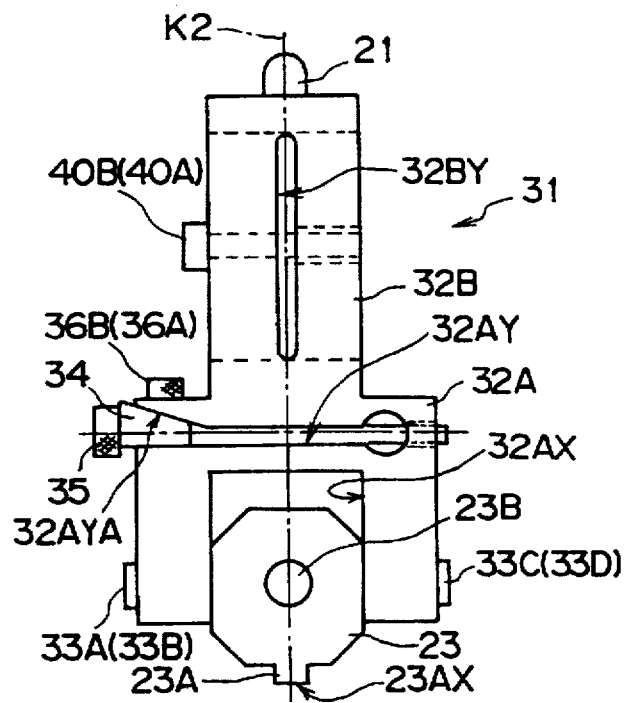
FIG. 6A        FIG. 6B
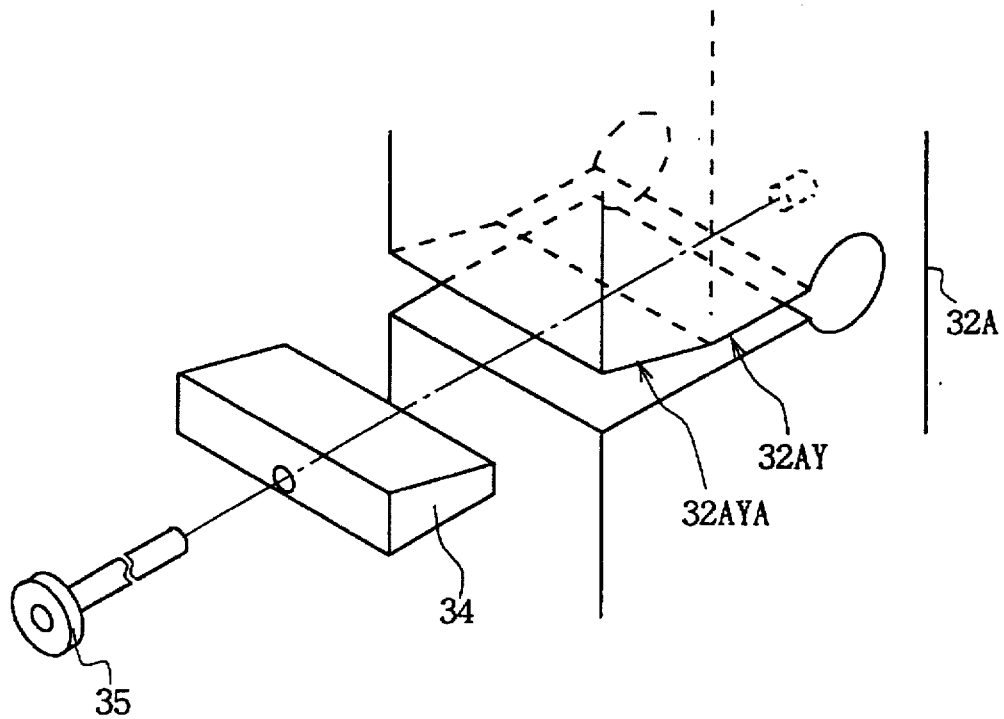
FIG. 7

PRESSURE-BONDING UNIT AND PRESSURE-BONDING HEAD UNIT

BACKGROUND OF THE INVENTION

1. Field of the Invention

This invention relates to a pressure-bonding unit and a pressure-bonding head unit, and is applicable to a thermocompression-bonding unit and a head unit used in the thermocompression-bonding unit which thermocompression-bonds a temporarily fixed tape carrier package (TCP) to a liquid crystal panel at the predetermined position of the circumferential portion of the liquid crystal panel through an anistropic conductive film (ACF).

2. Description of the Related Art

Heretofore, in a liquid crystal panel used as a display device in a television set or office automation equipment, a TCP, where IC chips are mounted on a polyimide film having a predetermined conductive pattern, has been used as a driving electronic component.

In this case, the TCP, as disclosed in Japanese Patent Laid Open No. 77698/95 for example, is temporarily fixed to the liquid crystal panel through the ACF so that the electrodes, formed on one end of the polyimide film, are respectively opposed to corresponding electrodes formed on the circumferential portion of the liquid crystal panel, and then this portion is bonded to the liquid crystal panel with thermocompression.

Now, FIG. 1 shows the construction of a conventionally used thermocompression-bonding unit 3 by which a TCP 2, temporarily fixed to a liquid crystal panel 1 in this way, is bonded to the liquid crystal panel 1 with thermocompression.

In this thermocompression-bonding unit 3, a pair of Guide rails 5A and 5B are arranged in parallel with a back end forth direction (arrow x) on a base table 4, and a plate-shaped panel receiving table 6 is disposed on the Guide rails 5A and 5B so that it is freely movable. In this way, the liquid crystal panel 1 to be processed as supplied from a liquid crystal panel supply mechanism (not shown) onto this panel receiving table 6 can be freely carried in a back and forth direction while positioned on the table 6.

Also, on the rear end portion of the base table 4, a pressurizing cylinder 8 is fixed and disposed by first and second pressurizing unit posts 7A and 7B mounted on the base table 4. A pressurizing plate 10 is attached to the output shaft of the pressurizing cylinder 8 through a supporting member 9. On the under surface of the pressurizing plate 10, a plurality of head units 11 are mounted in parallel.

In this case, the head unit 11, as shown in FIG. 2, is composed of a head holder 20 where an inverted U-shaped head holding portion 20B is formed integrally with the lower end of a square-shaped supporting portion 20A and a pressure-bonding head 23 fixed in the concave portion 20BX of the holding portion 20B of the head holder 20 by a first screw 22 and a second screw (not shown) which are inserted in the front and rear direction of the head holding portion 20B. The head unit is attached in the condition where the head 11 is positioned at a predetermined position of the under surface of the pressurizing plate 10 (FIG. 1) through a pin 21 fixed on the top surface of the supporting portion 20A of the head holder 20.

On the lower end surface of the pressure-bonding head 23 of respective head units 11, a protruding portion 23A in the form of a rectangular parallelepiped is provided perpendicular to a virtual line K1 passing through the first and second screws 22, and also a heater 23B is provided in the central portion of the pressure-bonding head 23. Thus, the lower end surface 23AX (hereinafter referred to as a pressure-bonding surface 23AX) of the protruding portion 23A of the pressure-bonding head 23 can be heated to a predetermined temperature by the heater 23B.

Thus, in this pressure-bonding unit 3, if the liquid crystal panel 1 of an object to be processed, where TCPs 2 are temporarily fixed on the circumferential portion through the ACF (not shown), is supplied onto the panel receiving table 6 at the time of operation, as shown in FIG. 1, first the panel receiving table 6 retracts along the guide rails 5A and 5B so that this liquid crystal panel 1 is conveyed up to a predetermined processing position set to the rear end portion of the base table 4. Subsequently, the pressurizing cylinder 8 is driven and the pressurizing plate 10 is moved down, whereby the pressure-bonding surface 23AX of the pressure-bonding head 23 of each head unit 11 is pressed against the liquid crystal panel 1 through the respective corresponding TCPs 2.

When this occurs, in the respective head units 11, the pressure-bonding surfaces 23AX of the pressure-bonding heads 23 have been heated to a predetermined temperature by the heaters 23B, respectively, each corresponding TCP 2 bonds to the liquid crystal panel 1 through the ACF with thermocompression.

Subsequently the pressurizing cylinder 8 is driven and the pressurizing plate 10 moves up. Thereafter, the panel receiving table 6 advances and thereby sends this liquid crystal panel 1 to the following manufacturing line. Thereafter, this thermocompression-bonding unit 3 further repeats the same operation whenever the liquid crystal panel 1 is supplied onto the panel receiving table 6. With this, the TCPs 2 temporarily fixed to the liquid crystal panels 1 are sequentially bonded with thermocompression.

Incidentally, in this type of the thermocompression-bonding unit 3, it is needed to pressure-bond the pressure-bonding surface 23AX of the pressure-bonding head 23 of the head unit 11 against the top surface of the liquid crystal panel 1 to be processed through the TCP 2 with a high degree of parallelization, in order to bond the TCP 2 which is temporarily fixed through the ACF to the liquid crystal panel 1 to the liquid crystal panel 1 certainly with thermocompression.

For example, as shown in FIG. 3, if the pressure-bonding surface 23AX of the pressure-bonding head 23 is pressed against the TCP 2 with the pressure-bonding surface 23AX being in an inclining state to the liquid crystal panel 1, pressure is concentrated at the one end portion of an inclined direction, which is closer than the other end portion to the TCP 2, on the pressure-bonding surface 23AX of the head unit 11, so that it is difficult to give pressure to the TCP 2 through the other end portion of the pressure-bonding surface 23AX. Also, it is difficult to pressure-bond the portion of the TCP 2 facing the other end portion of the pressure-bonding surface 23AX against the liquid crystal panel 1. Therefore, it is conventionally necessary that the degree of parallelization between the pressure-bonding surface 23AX of the head unit 11 and the liquid crystal panel 1 is about 5 micrometers.

For this reason, as a method of regulating the degree of parallelization between the pressure-bonding surface 23AX of the pressure-bonding head 23 of the head unit 11 and the supplied liquid crystal panel 1, the thermocompression-bonding unit 3 has conventionally used a method in which the first and second screws 22 of the head unit 11 are untightened, then the pressure-bonding surface 23AX of the pressure-bonding head 23 is pressed against the top surface of the panel receiving table 6 and wherein, in this state, the first and second screws 22 are tightened (that is, the pressure-bonding surface 23AX of the pressure-bonding head 23 is conformed to the top surface of the panel receiving table 6).

However, in the conventional head 11, as described above, the regulation of the inclination (arrow $\theta_1$ shown in FIG. 2) of the pressure-bonding surface 23AX of the pressure-bonding head 23 on the plane perpendicular to the virtual line K1 passing through the first and second screws 22 can be easily performed, but there is the problem that the regulation of the inclination (arrow $\theta_2$ shown in FIG. 2) of the pressure-bonding surface 23AX of the pressure-bonding head 23 on the plane perpendicular both to the aforementioned plane and the pressure-bonding surface 23AX of the pressure-bonding head 23 becomes difficult because it is needed to regulate the inclination of the panel receiving table 6 or regulate the mounted state of the head holder 20 on the pressurizing plate 10.

In addition, the head unit 11 of the conventional construction is not provided with a mechanism for regulating a minute angle of the regulation of the inclination (arrow $\theta$) of the pressure-bonding surface 23AX of the pressure-bonding head 23 on the plane perpendicular to the aforementioned virtual line K1, and therefore the minute regulation of this inclination is difficult. Furthermore, the accuracy of the degree of parallelization between the liquid crystal panel 1 and the pressure-bonding surface 23AX of the pressure-bonding head 23, obtained by the regulating operation, easily depends upon the rigidity of the panel receiving table 6, and therefore, there is the problem that the degree of parallelization is difficult to regulate accurately.

Moreover, in the head unit 11 of the conventional structure, because the pressure-bonding head 23 is freely rotatably attached to the head holder 20 by the first and second screws 22, the degree of parallelization is easy to change due to thermal stress after regulation, accuracy is difficult to keep at a high temperature and a high pressure, and thus there is the problem that reliability is low.

SUMMARY OF THE INVENTION

In view of the foregoing, an object of this invention is to provide a thermocompression-bonding unit and a pressure-bonding head unit which are structurally simple and where reliability is high.

The foregoing object and other objects of the invention have been achieved by the provision of a pressure-bonding unit, according to a first embodiment, which provides: a pressure-bonding head holding means for integrally fixing and holding the pressure-bonding head being formed with a cutout from the side of a first direction in parallel with the pressure-bonding surface of the pressure-bonding head and also being formed with an opening perpendicular both to the first direction and the pressure-bonding surface; first deformation means for deforming the pressure-bonding head holding means so that a cutout inlet of the cutout of the pressure-bonding head holding means opens or closes by a desired amount; and second deformation means for deforming the pressure-bonding head holding means so that one opening end or the other opening end of the opening is crushed in a direction parallel to the first direction by a desired amount.

Further, according to the second embodiment, the pressure-bonding head is fixed and held integrally by the pressure-bonding head holding means, which is formed with a cutout from the side of a first direction in parallel with the pressure-bonding surface and also is formed with an opening perpendicular both to the first direction and the pressure-bonding surface. In addition, the pressure-bonding head unit is composed of first deformation means for deforming the pressure-bonding head holding means so that a cutout inlet of the cutout opens or closes by a desired amount; and second deformation means for deforming the pressure-bonding head holding means so that one opening end or the other opening end of the opening is crushed in a direction parallel to the first direction by a desired amount.

In this case, in the first and second embodiments, the pressure bonding head is fixed and held integrally by the pressure-bonding head holding means, which is formed with a cutout from the side of a first direction in parallel with the pressure-bonding surface and also is formed with an opening perpendicular both to the first direction and the pressure-bonding surface. In addition, there is provided: first deformation means for deforming the pressure-bonding head holding means so that a cutout inlet of the cutout opens or closes by desired amount; and second deformation means for deforming the pressure-bonding head holding means so that one opening end or the other opening end of the opening is crushed in a direction parallel to the first direction by a desired amount. With this, the inclination of the pressure-bonding surface of the pressure-bonding head on the plane, which is perpendicular both to the first direction and the pressure-bonding surface of the pressure-bonding head, can be regulated by regulating the first deformation means, and also the inclination of the pressure-bonding surface of the pressure-bonding head on the plane, which is perpendicular both to the aforementioned plane and the pressure-bonding surface of the pressure-bonding head, can be regulated by regulating the second deformation means.

The nature, principle and utility of the invention will become more apparent from the following detailed description when read in conjunction with the accompanying drawings in which like parts are designated by like reference numerals or characters.

BRIEF DESCRIPTION OF THE DRAWINGS

In the accompanying drawings:

FIGS. 6A and 6B are front and side views showing the construction of the head according to the embodiment;

FIG. 7 is a schematically perspective view showing the construction of the head according to the embodiment;

DETAILED DESCRIPTION OF THE EMBODIMENT

Figure 1:
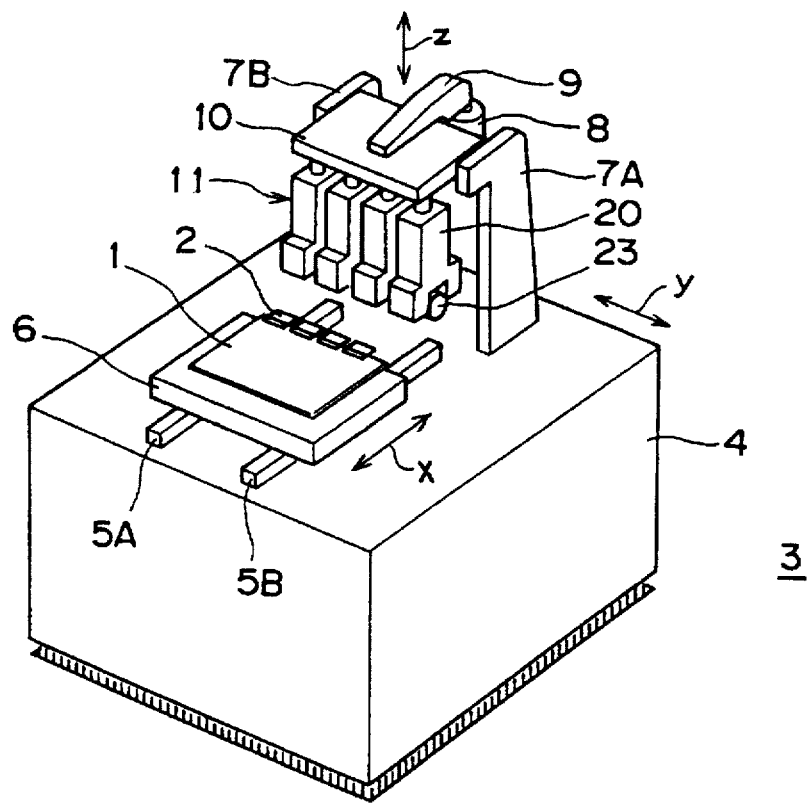
FIG. 1 is a schematically perspective view showing the entire construction of a conventional thermocompression-bonding unit.
Figure 3:
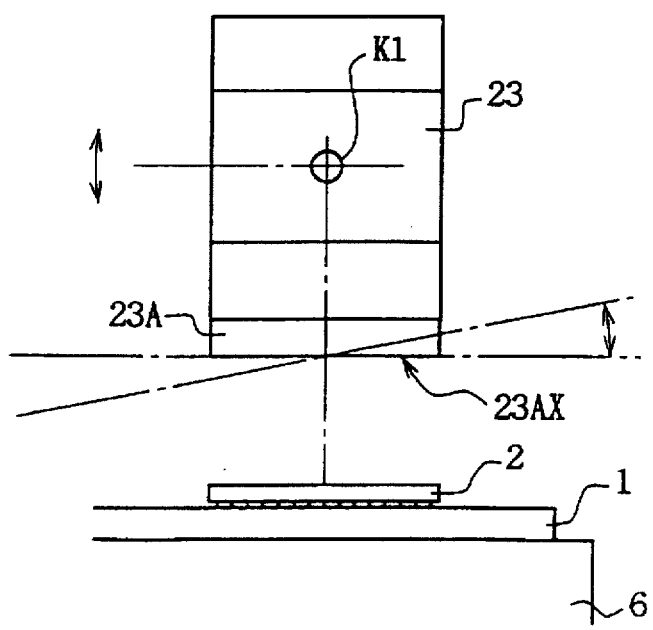
FIG. 3 is a side view explaining the inclination of the pressure-bonding surface of the pressure-bonding head facing the liquid crystal panel.
Figure 4:
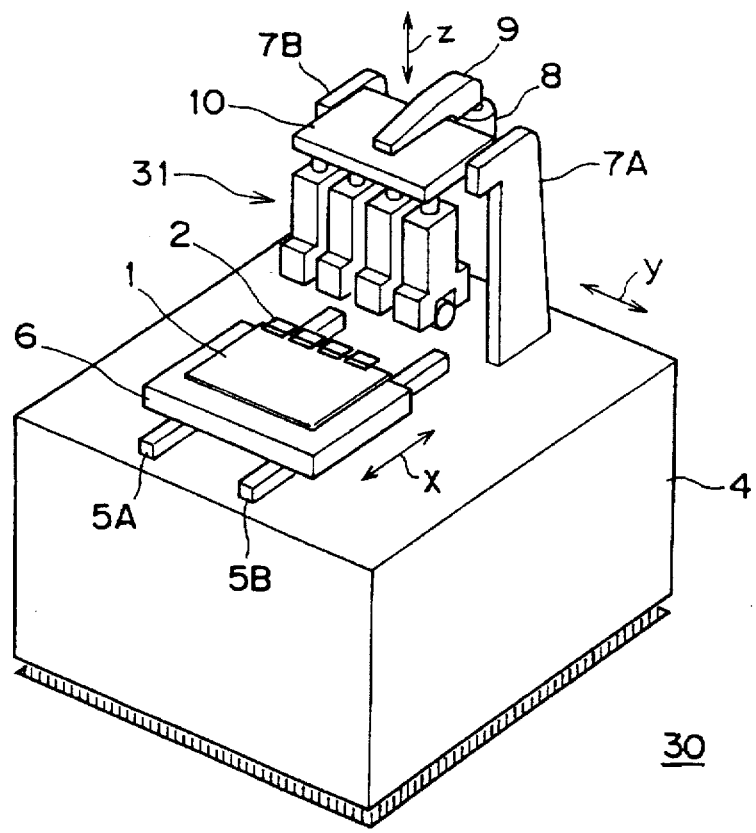
FIG. 4 is a schematically perspective view showing the entire construction of a thermocompression-bonding unit according to an embodiment.

Preferred embodiments of this invention will be described with reference to the accompanying drawings:

In FIG. 4 where the same reference numerals are applied to parts corresponding to FIG. 1, 30 generally indicates a thermocompression-bonding unit to which the present invention is applied. The thermocompression-bonding unit 30 is constructed in the same way as the thermocompression-bonding unit 3 shown in FIG. 1, except for the construction of each head unit 31.

Figure 2:
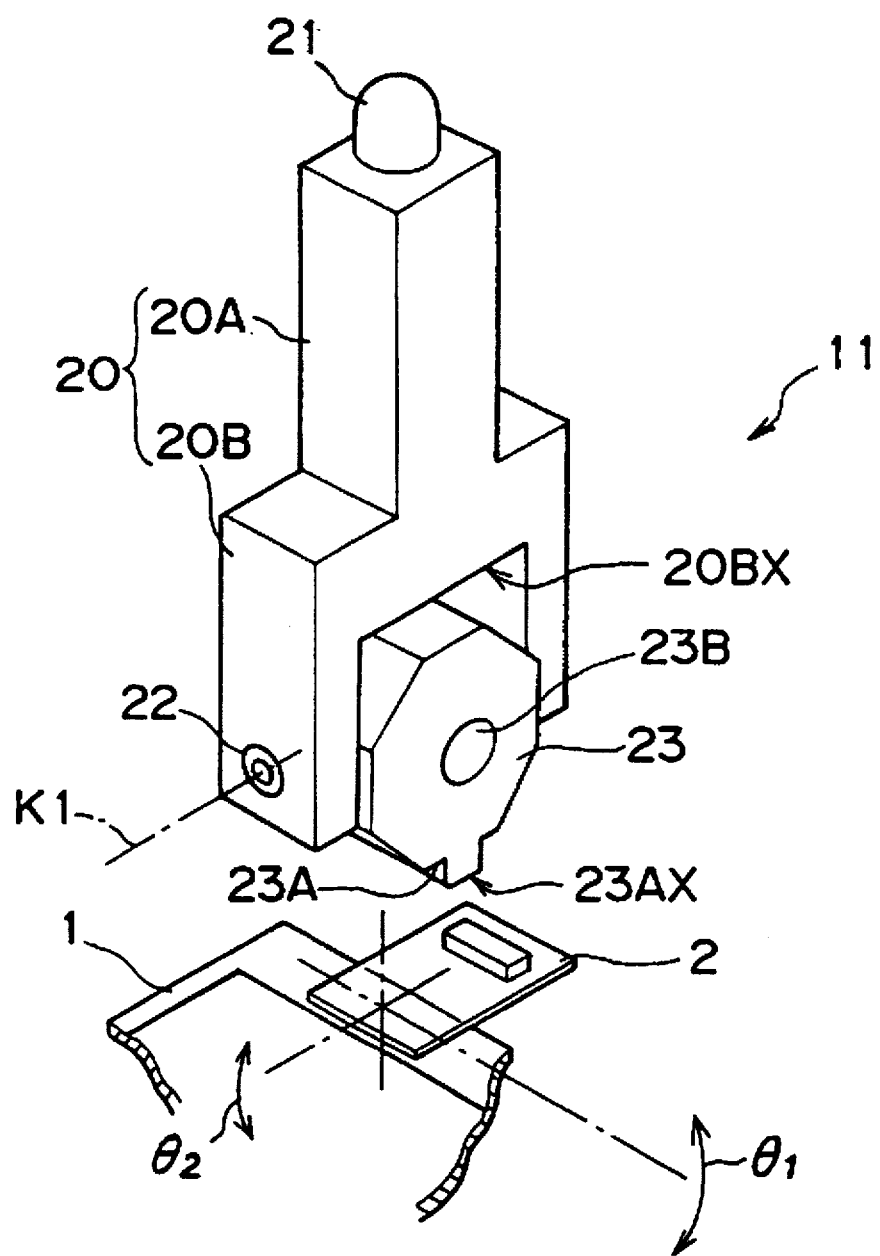
FIG. 2 is a schematically perspective view showing the construction of the conventional head.
Figure 5:
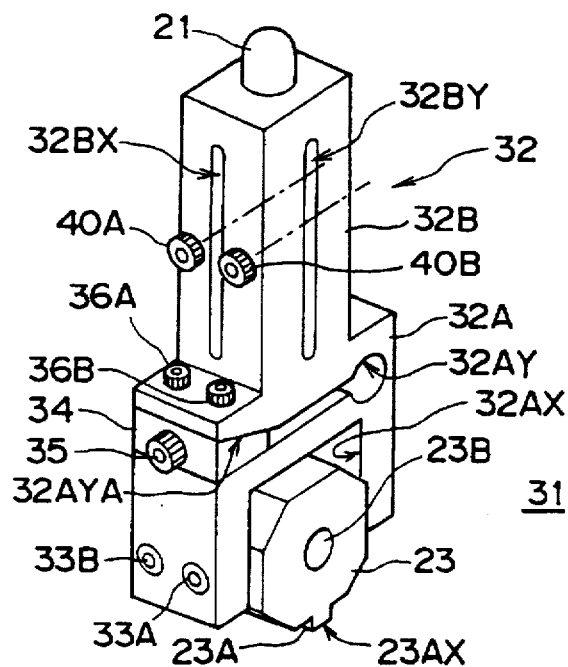
FIG. 5 is a schematically perspective view showing the construction of the head according to the embodiment.

The head unit 31, as shown in FIGS. 5, 6A, and 6B where the same reference numerals are applied to parts corresponding to FIG. 2, is constituted by a head holder 32 and a pressure-bonding head 23. The pressure-bonding head 23 is fixed by fixation screws 33A to 33D so as to maintain the state that the pressure-bonding surface 23AX is perpendicular to the center axis K2 of the head holder 32 within the recess portion 32AX of an inverted U-shaped head holding portion 32A forming the lower portion of the head holder 32.

Also, in the upper portion of the head holding portion 32A of the head holder 32, a cutout 32AY having a taper portion 32AYA at the cutout inlet is formed perpendicular to the center axis K2 of the head holder 32 (that is, parallel to the pressure-bonding surface 23AX of the pressure-bonding head 23) so as to reach from the front surface of the head holding portion 32A to the vicinity of the rear surface.

In this case, a pillar-shaped wedge 34 having an inclined surface of the same angle of inclination as the taper portion 32AYA of the cutout 32AX shown in FIG. 7 is fitted into the cutout inlet of the cutout 32AY from the forward side. Also, a $\theta_2$ direction adjustment screw 35 for meshing the point portion of the wedge 34 with the head holding portion 32A of the head holder 32 at the depth portion of the cutout 32AY is screwed in the wedge 34.

With this, in this head unit 31, the wedge 34 is moved in the rear direction along the cutout 32AY of the head holder 32 by rotating the $\theta_2$ direction adjustment screw 35 in the tightening direction, thereby the cutout 32AY can be opened in proportion to the moved amount of the wedge 34. Also, the wedge 34 is moved in the front direction along the cutout 32AY of the head holder 32 by rotating the $\theta_2$ direction adjustment screw 35 in the untightening direction, thereby the cutout 32AY can be closed in proportion to the moved amount of the wedge 34.

Figures 8A, 8B:
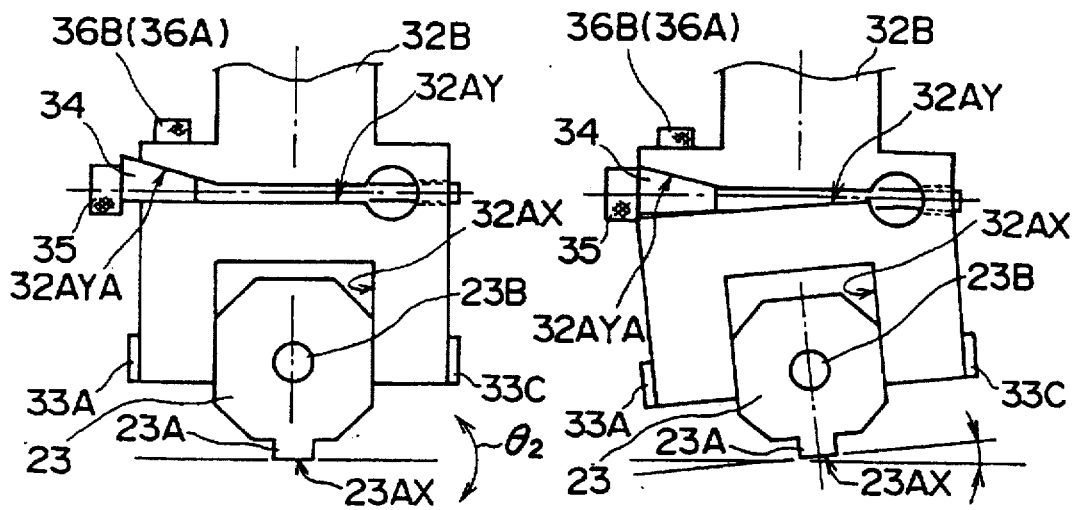
FIGS. 8A and 8B are schematically side views explaining the regulation of the inclination of the front and rear direction of the head according to the embodiment.

Therefore, in the head unit 31, the lower end portion of the head holder 32 can be varied from a normal state such as that shown in FIG. 8A to a rearwardly inclined state such as that shown in FIG. 8B by rotating the $\theta_2$ direction adjustment screw 35 in the tightening direction, so that the pressure-bonding surface 23AX of the pressure-bonding head 23 held in the head holder 32 can be inclined in the rear direction, while the lower end portion of the head holder 32 can be varied from that state to a forwardly inclined state by rotating the $\theta_2$ direction adjustment screw 35 in the untightening direction, so that the pressure-bonding surface 23AX of the pressure-bonding head 23 can be inclined in the front direction. Therefore, the pressure-bonding surface 23AX of the pressure-bonding head 23 can be adjusted in the inclination of the rear and front direction (arrow $\theta_2$ shown in FIG. 8A).

Therefore, first and second wedge fixing screws 36A and 36B are screwed into the upper front end portion of the head holding portion 32A of the head holder 32. Therefore, the wedge 34 can be fixed within the cutout 32AY of the head holder 32 by strongly tightening the first and second wedge fixing screws 36A and 36B. Thereby, in the head in unit 31, the head holder 32 can be held a forwardly or a rearwardly inclined state by strongly tightening the wedge fixing screws 36A and 36B, therefore, in the pressure-bonding surface 23AX of the pressure-bonding head 23, the inclined state of the rear direction or the front direction can be held in an adjusted state.

On the other hand, in a pillar-shaped support portion 32B forming the upper portion of the head holder 32, a first narrow and long opening portion 32BX is formed parallel to the center axis K2 of the head holder 32 (that is, perpendicular to the pressure-bonding surface 23AX of the pressure-bonding head 23) so as to reach from the laterally central portion of the front surface to the laterally central portion of the rear surface. Also, in the support portion 32B of the head holder 32, a second narrow and long opening portion 32BY is formed perpendicular to the first opening portion 32BX (perpendicular to the pressure-bonding surface 23AX of the pressure-bonding head 23) so as to reach from the laterally central portion of the right surface to the laterally central portion of the left surface.

Further, on the support portion 32B of the head holder 32, a first $\theta_1$ direction adjustment screw 40A is attached so that, among four constitutional portions forming the central portion of the head holder 32 partitioned by the first and second opening portions 32BX and 32BY, the screw 40A is inserted through the left constitutional portion of FIG. 5 and meshes with the left rear constitutional portion, and also a second $\theta_1$ direction adjustment screw 40B is attached so that it is inserted through the right constitutional portion of FIG. 5 and meshes with the right rear constitutional portion.

Figures 9A, 9B:
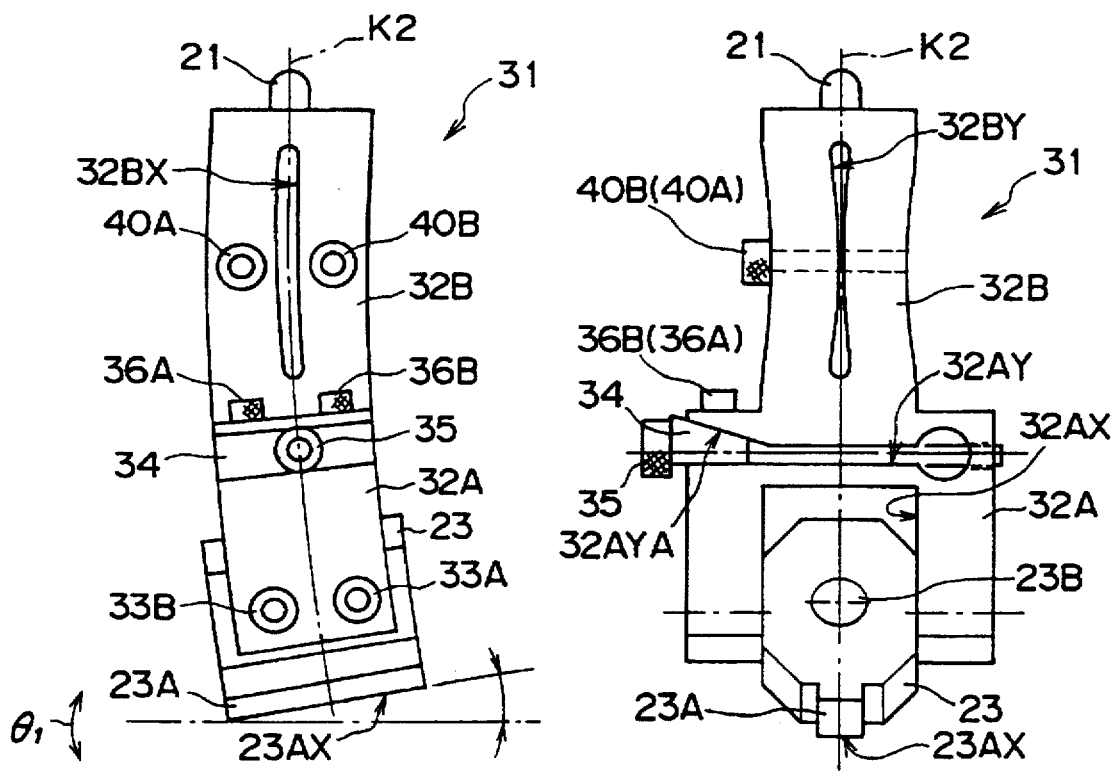
FIGS. 9A and 9B are schematically front and side views explaining the regulation of the inclination of the left and right direction of the head according to the embodiment.

With this, in this head unit 31, by strongly tightening, for example, the second $\theta_1$ direction adjustment screw 40B, the right constitutional portion and the right rear constitutional portion of the support portion 32B of the head holder 32 are bent so that the central portions get close to each other as shown in FIGS. 9A and 9B (that is, these constitutional portions are deformed so that one opening end of the second opening portion 32BY is compressed in the direction parallel to the front and rear direction by a desired amount). With this, the height of these constitutional portions, viewed from the front direction, is shortened, thereby bending the head holder 32 as a whole in the right direction of FIGS. 9A and 9B. By strongly tightening the first $\theta_1$ direction adjustment screw 40A in the same way as this, the left constitutional portion and the left rear constitutional portion of the support portion 32B of the head holder 32 are deformed so that the other opening end of the second opening portion 32BY is compressed in the direction parallel to the front and rear direction by desired amount. With this, the head holder 32 is bent as a whole in the left direction.

Therefore, in the head unit 31, the pressure-bonding surface 23AX of the pressure-bonding head 23 can be inclined in the right direction as shown in FIG. 9A by strongly tightening the second $\theta_1$ direction adjustment screw 40B, while the pressure-bonding surface 23AX of the pressure-bonding head 23 can be inclined in the left direction in FIG. 9A by strongly tightening the first $\theta_1$ direction adjustment screw 40A. Therefore, the head unit 31 can regulate the inclination of the left and right direction of the pressure-bonding surface 23AX of the pressure-bonding head (arrow $\theta_1$).

Figure 10:
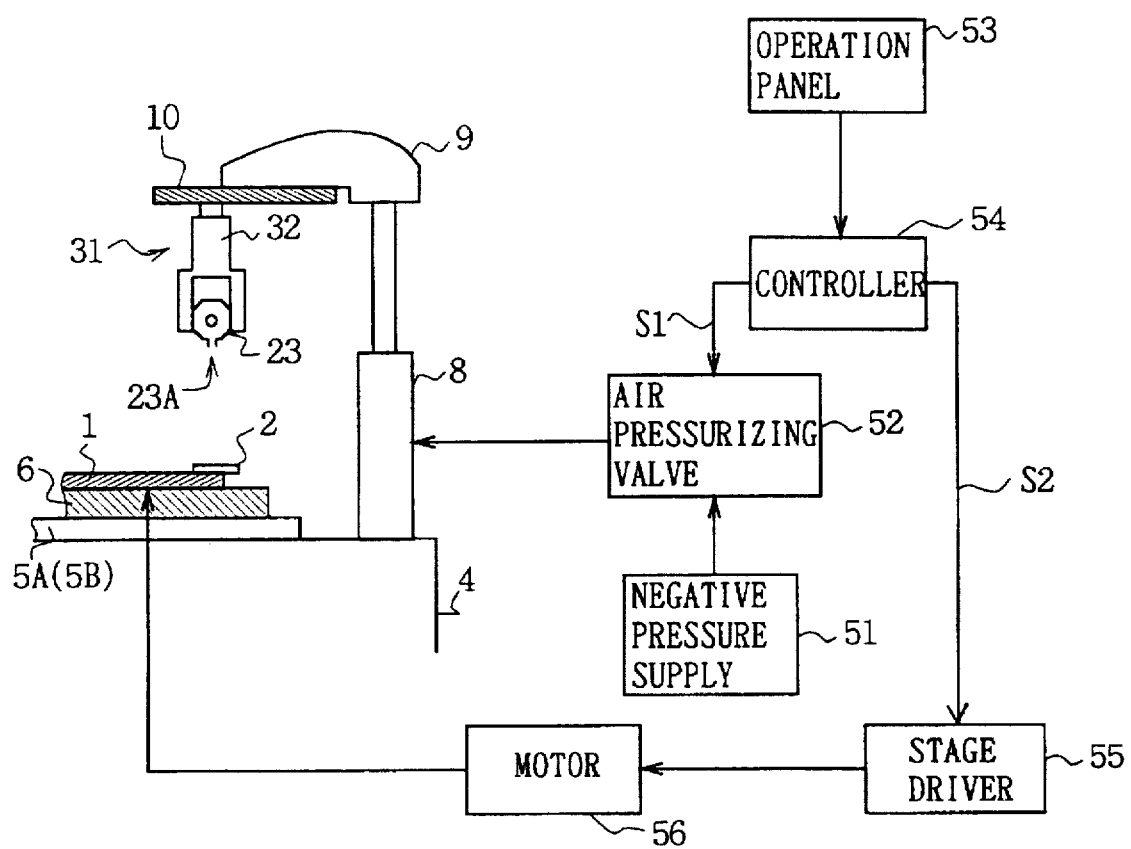
FIG. 10 is a block diagram showing the construction of the driving control system of the thermocompression-bonding unit according to the embodiment.

FIG. 10 shows the construction of a driving control system of a thermocompression-bonding unit 30.

As FIG. 10 shows obviously, negative pressure outputted from a negative pressure supply 51 is supplied to a pressurizing cylinder 8 through an air pressurizing valve 52 in the thermocompression-bonding unit 30.

In this case, the air pressurizing valve 52 supplies or stops supplying the negative pressure outputted from the negative pressure supply 51 to the pressurizing cylinder 8 in order to drive the pressurizing cylinder 8 by opening or closing a valve of the air pressurizing valve 52 according to a control signal S1 outputted from a controller 54 on the basis of an inputted driving order supplied to the controller 54 via an operation panel 53. Thereby, each head unit 31 can be ascended and descended by receiving the negative pressure via a pressurizing plate 10.

Also, the controller 54 outputs a control signal S2 to a stage driver 55 on the basis of the inputted driving order supplied from the operation panel 53, so that a motor 56 for driving a panel receiving stand 6 can be controlled through the stage driver 55. Therefore, the panel receiving stand 6 can be moved in the rear and the front direction (arrow "x" shown in FIG. 4) according to necessity.

With this, in operation, the controlle 54 respectively outputs the control signal S1 and S2 to the air pressurizing valve 52 and stage driver 55 with predetermined timing and makes the pressurizing cylinder 8 and the panel receiving stand 6 drive, thereby the thermocompression-bonding unit 30 can operate similar to FIG. 1 as a whole. Thereby, TCP 2 temporarily fixed to a liquid crystal panel 1 to be processed which is supplied onto the panel receiving stand 6.

In the foregoing structure, the thermocompression-bonding unit 30, after untightening the wedge fixing screws 36A and 36B of the head unit 31, can regulate the inclination of the front and rear direction of the pressure-bonding surface 23AX of the pressure-bonding head 23 by turning the $\theta_2$ direction adjustment screw 35 in the tightening or the untightening direction. Thereafter, the thermocompression-bonding unit 30 can hold the inclination of the front and rear direction of the pressure-bonding surface 23AX of the pressure-bonding head 23 (arrow $\theta_2$) to regulated state by tightening the wedge fixing screws 36A and 36B of the head unit 31.

Further, the thermocompression-bonding unit 30 can regulate the inclination of the left and right direction of the pressure-bonding surface 23AX of the pressure-bonding head 23 (arrow $\theta_1$) and hold it to the regulated state, by turning the first and second $\theta_1$ direction adjustment screws 40A and 40B in the tightening or the untightening direction.

Therefore, in the pressure-bonding unit 30, pressure-sensitive papers are respectively arranged on the position of the panel receiving table 6 opposite to each head unit 31 with the panel receiving table 6 rear. Then, after each head unit 31 is pressured to the panel receiving table 6 by driving the pressurizing cylinder 8, the pressure-bonding surface 23AX of the pressure-bonding head 23 of the respective head units 31 and the liquid crystal panel 1 respectively positioned on the panel receiving table 6 are regulated to be in the parallel state by turning the $\theta_2$ direction adjustment screw 35 and $\theta_1$ direction adjustment screws 40A and 40B in the tightening or the untightening direction according to the state of the pressured pressure-sensitive paper.

In this case, in the normal thermocompression-bonding unit 30 such as described above, the regulation range of the inclination of the front and rear direction (arrow $\theta_2$) or the inclination of the left and right direction (arrow $\theta_1$) of the pressure-bonding surface 23AX of the pressure-bonding head 23 actually required of each head unit 31 is about several micrometers to several tens micrometers in terms of a degree of parallelization. Therefore, in practical use, this range can be sufficiently coped with by the operation of deforming the head holder 32 of this head unit 31.

Also, this head unit 31, as described above, can independently regulate the inclination of the front and rear direction (arrow $\theta_2$) or inclination of the left and right direction (arrow $\theta_1$) of the pressure-bonding surface 23AX of the pressure-bonding head 23, respectively, and also can perform this regulation at units of micrometers. Furthermore, because the pressure-bonding head 23 is fixed to the head holder 32, the accuracy hardly varies by the repeated application of heat or applications of pressure, and not only the head unit 31 itself but also the thermocompression-bonding unit 30 as a whole can be enhanced in reliability. And, this head unit 31 is easy to use, because it can perform the regulations of the inclination of the front and rear direction (arrow $\theta_2$) and inclination of the left and right direction (arrow $\theta_1$) of the pressure-bonding surface 23AX of the pressure-bonding head 23 from one direction side (forward direction side).

Furthermore, this head unit 31 can be inexpensively constructed because it is structurally simple. In addition, because the entire lateral width is small (the same as prior art), the regulation of a small head of a multi-head type is possible.

According to the foregoing construction, the pressure-bonding head 23 is fixed integrally to the lower end portion of the head holder 32 of the pressure-bonding head 23. The head holder 32 is formed with the cutout 32AY parallel to the pressure-bonding surface 23AX of the pressure-bonding head 23 and also is formed with the first and second opening portions 32BX and 32BY perpendicular to the pressure-bonding surface 23AX of the pressure-bonding head 23. The shape of the cutout 32AX, the first opening portion 32BX, or the second opening portion 32BY (that is, head holder 32) can be deformed by the $\theta_2$-direction adjustment screw 35, the first el-direction adjustment screw 40A, or the second $\theta_1$-direction adjustment screw 40B as needed. With this, the inclination of the front and rear direction ($\theta_2$ direction) or inclination of the left and right direction ($\theta_1$ direction) of the pressure-bonding surface 23AX of the pressure-bonding head 23 can be independently regulated, respectively, and also this regulation can be performed at units of micrometers. Furthermore, a change in accuracy resulting from the repeated applications of heat and application of pressure can be reduced. In this way, a pressure-bonding unit and a pressure-bonding head unit, which are structurally simple and where reliability is high, can be realized.

While the aforementioned embodiment has been described with reference to a case where the head unit 31 according to the present invention is applied to the thermocompression-bonding unit 30 which bonds the TCP2 temporarily fixed to the circumferential end portion of the liquid crystal panel 1 to this liquid crystal panel 1 with thermocompression, the present invention is not limited to this. That is, the invention is suitably applicable to various kinds of pressure-bonding units or pressure-bonding head units, as long as they are pressure-bonding units and pressure-bonding head units which have a head with a pressure-bonding surface of predetermined shape and where the pressure-bonding surface of the head is contacted with pressure to a predetermined portion of a second object temporarily fixed to a first object and where the second object is pressed to the first object so that the second object is bonded to the first object with pressure.

In addition, while the aforementioned embodiment has been described with reference to a case where the pressure-bonding head 23, provided with the protruding portion 23A in the form of a rectangular parallelepiped at the under surface and with the heater 23B at the central portion, is applied as a pressure-bonding head unit which bonds the TCP2 temporarily fixed to the circumferential end portion of the liquid crystal panel 1 to this liquid crystal panel 1 with thermocompression, the present invention is not limited to this. That is, the invention is applicable to pressure-bonding head units of various shapes, as long as they have a pressure-bonding surface of predetermined shape.

Furthermore, while the aforementioned embodiment has been described with reference to a case where the head holder 32, constructed as shown in FIGS. 5, 6A, and 6B, is used as the pressure-bonding head holding means for integrally holding the pressure-bonding head 23, the present invention is not limited to this. That is, various kinds of pressure-bonding head holding means can be used as the pressure-bonding head holding means for integrally holding the pressure-bonding head 23, as long as they are pressure-bonding head holding means formed with a cutout from the predetermined side of a first direction in parallel with the pressure-bonding surface of the pressure-bonding head and also formed with an opening perpendicular both to the first direction and the pressure-bonding surface.

Moreover, although the aforementioned embodiment has been described with reference to a case where the $\theta_2$-direction adjustment means 35, the wedge 34, and the fixation screws 36A and 36B are applied as the deformation means for deforming the head holder 32 by opening or closing the cutout inlet of the cutout 32AY of the head holder 32 by a desired amount, the present invention is not limited to this. That is, various kinds of deformation means can be applied as the deformation means for deforming the head holder 32, if they can deform the head holder 32 (or other pressure-bonding head holding means) so that the cutout inlet of the cutout 32AY of the head holder 32 (or other pressure-bonding head holding means) opens or closes by a desired amount.

In this case, as one form of this deformation means, the deformation means is formed so that it has a fitting member of predetermined shape fitted into the cutout inlet of the cutout 32AY of the head holder 32 (or other pressure-bonding head holding means) and also has a first adjustment screw disposed so that it is inserted through the fitting member and that a point portion of the first adjustment screw meshes with the pressure-bonding head holding means at a depth portion of said cutout 32AY of the head holder 32 (or other pressure-bonding head holding means).

Moreover, although the aforementioned embodiment has been described with reference to a case where the first and second $\theta_1$-direction adjustment screws 40A and 40B are applied as the deformation means for deforming the head holder 32 by deflecting the constitutional portions on the right front and right rear sides of the support portion 32B of the head holder 32 so that the central portions of the constitutional portions get close to one another, the present invention is not limited to this. That is, various kinds of deformation means can be applied as the deformation means for deforming the head holder 32, if they can deform the head holder 32 (or other pressure-bonding head holding means) so that one opening end or the other opening end of the opening portion 32BX or 32BY (opening perpendicular both to a predetermined first direction and the pressure-bonding surface of the pressure-bonding head, formed in other pressure-head holding means) of the head holder 32 (or other pressure-head holding means) is crushed in a direction parallel to the front or rear direction (or the predetermined first direction) by a desired quantity.

As described above, in accordance with the first and the second embodiment, the pressure-bonding head unit comprises: a pressure-bonding head; pressure-bonding head holding means for integrally fixing and holding the pressure-bonding head, the pressure-bonding head holding means being formed with a cutout from a first direction side in parallel with the pressure-bonding surface of the pressure-bonding head and also being formed with opening perpendicular both to the first direction and the pressure-bonding surface; first deformation means for deforming the pressure-bonding head holding means so that a cutout inlet of the cutout opens or closes by desired amount; and second deformation means for deforming the pressure-bonding head holding means so that one opening end or the other opening end of the opening is crushed in a direction parallel to the first direction by desired amount. With this, the inclination of the pressure-bonding surface of the pressure-bonding head on the plane, which is perpendicular both to the first direction and the pressure-bonding surface of the pressure-bonding head, can be regulated by regulating the first deformation means, and also the inclination of the pressure-bonding surface of the pressure-bonding head on the plane, which is perpendicular both to the aforementioned plane and the pressure-bonding surface of the pressure-bonding head, can be regulated by regulating the second deformation means. In this way, a pressure-bonding unit and a pressure-bonding head unit, which are structurally simple and where reliability is high, can be realized.

While features of the invention have been described in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. A pressure-bonding unit, where a pressure-bonding surface of a head is contacted with pressure to a predetermined portion of a second object temporarily fixed to a first object and where said second object is pressed to said first object so that said second object is bonded to the first object with pressure, comprising:

a pressure-bonding head having said pressure-bonding surface;

pressure-bonding head holding means for integrally fixing and holding said pressure-bonding head, the pressure-bonding head holding means being formed with a cutout from the side of a first direction side in parallel with said pressure-bonding surface and also being formed with an opening perpendicular both to said first direction and said pressure-bonding surface;

first deformation means for deforming said pressure-bonding head holding means so that a cutout inlet of said cutout opens or closes by a desired amount; and second deformation means for deforming said pressure-bonding head holding means so that one opening end or the other opening end of said opening of said pressure-bonding head holding means is crushed in a direction parallel to said first direction by desired amount.

2. The pressure-bonding unit according to claim 1, wherein:

said first deformation means having:
  a fitting member fitted into said cutout inlet of said cutout; and
  a first adjustment screw disposed so that it is inserted through said fitting member and that a point portion of the first adjustment screw screws with said pressure-bonding head holding means at a depth portion of said cutout; and said second deformation means having:

a second adjustment screw which is inserted through said pressure-bonding head holding means from said first direction side up to said opening, in the vicinity of said one opening end of said opening of said pressure-bonding head holding means, and which screws with said pressure-bonding head holding means between a second direction side opposite to said first direction side and said opening of said pressure-bonding head holding means; and a third adjustment screw which is inserted through said pressure-bonding head holding means from said first direction side up to said opening, in the vicinity of said other opening end of said opening of said pressure-bonding head holding means, and which screws with said pressure-bonding head holding means between a second direction side opposite to said first direction side and said opening of said pressure-bonding head holding means.

3. A pressure-bonding head unit comprising:

a pressure-bonding head having a pressure-bonding surface of predetermined shape;

pressure-bonding head holding means for integrally fixing and holding said pressure-bonding head, said pressure-bonding head holding means being formed with a cutout from a first direction side in parallel with said pressure-bonding surface of said pressure-bonding head and also being formed with an opening perpendicular both to said first direction and said pressure-bonding surface of said pressure-bonding head;

first deformation means for deforming said pressure-bonding head holding means so that a cutout inlet of said cutout opens or closes by a desired amount; and second deformation means for deforming said pressure-bonding head holding means so that one opening end or the other opening end of said opening of said pressure-bonding head holding means is crushed in a direction parallel to said first direction by desired amount.

4. The pressure-bonding head unit according to claim 3, wherein:

said first deformation means having:

a fitting member fitted into said cutout inlet of said cutout; and a first adjustment screw disposed so that it is inserted through said fitting member and that a point portion of the first adjustment screw screws with said pressure-bonding head holding means at a depth portion of said cutout; and said second deformation means having:

a second adjustment screw which is inserted through said pressure-bonding head holding means from said first direction side up to said opening, in the vicinity of said one opening end of said opening of said pressure-bonding head holding means, and which screws with said pressure-bonding head holding means between a second direction side opposite to said first direction side and said opening of said pressure-bonding head holding means; and a third adjustment screw which is inserted through said pressure-bonding head holding means from said first direction side up to said opening, in the vicinity of said other opening end of said opening of said pressure-bonding head holding means, and which screws with said pressure-bonding head holding means between a second direction side opposite to said first direction side and said opening of said pressure-bonding head holding means.

* * * * *